United States Patent
Rossmann et al.

(10) Patent No.: US 11,240,948 B2
(45) Date of Patent: Feb. 1, 2022

(54) PORTION-WISE FILLING OF A RESERVOIR WITH BULK COMPONENTS

(71) Applicant: ASM Assembly Systems GmbH & Co. KG, Munich (DE)

(72) Inventors: Thomas Rossmann, Utting (DE); Stefan Seitz, Munich (DE); Norbert Heilmann, Munich (DE); Johannes Justinger, Landsberg am Lech (DE); Stefan Magg, Inning am Ammersee (DE); Stefan Geiger, Germering (DE)

(73) Assignee: ASM ASSEMBLY SYSTEMS GMBH & CO. KG

( * ) Notice: Subject to any disclaimer, the term of this patent is extended or adjusted under 35 U.S.C. 154(b) by 25 days.

(21) Appl. No.: 16/776,616

(22) Filed: Jan. 30, 2020

(65) Prior Publication Data

US 2020/0170153 A1    May 28, 2020

Related U.S. Application Data

(62) Division of application No. 15/845,430, filed on Dec. 18, 2017, now abandoned.

(30) Foreign Application Priority Data

Dec. 22, 2016  (DE) .................... 10 2016 125 495.9

(51) Int. Cl.
*H05K 13/02*     (2006.01)
*B65G 65/00*     (2006.01)
(Continued)

(52) U.S. Cl.
CPC .......... *H05K 13/028* (2013.01); *B65B 15/04* (2013.01); *B65B 25/00* (2013.01); *B65B 57/06* (2013.01);
(Continued)

(58) Field of Classification Search
CPC ..... H05K 13/028; H05K 13/021; B65G 65/23
(Continued)

(56) References Cited

U.S. PATENT DOCUMENTS 3,394,802 A    7/1968  Hershaft
4,062,385 A *  12/1977 Katusha ............ G03G 15/0882
                                                    141/89
(Continued)

FOREIGN PATENT DOCUMENTS

DE            2852552 A1    6/1980
DE         196 02 308 A1    7/1996
(Continued)

*Primary Examiner* — Jonathan Snelting
(74) *Attorney, Agent, or Firm* — Ostrolenk Faber LLP

(57) ABSTRACT

A magazine (200) is described for portion-wise receiving individualized bulk electronic components (298). The magazine (200) comprises (a) a receiving structure (110) which comprises multiple closable receiving cavities (112, 112a), which are arranged along a longitudinal axis (100a) of the receiving structure (110); (b) a cover structure (120) which is arranged at an upper side of the receiving structure (110), displaceable along the longitudinal axis (100a), so that in a closed position of the cover structure (120) all receiving cavities (112, 112a) are covered and in one opening position of multiple opening positions at least one receiving cavity (112) is free; and (c) a closure foil (225) which encompasses the cover structure (120) along the longitudinal axis (100a) in the form of a closed tape, wherein at least a part of the closure foil (225) is releasably connected to the receiving structure (110). Further, a device (430) is described for portion-wise transferring components (298) from one such magazine (200) into a reservoir (490) for a component supply device. Further, a method is described for portion-wise transferring components from one such magazine (200) into the one such reservoir (490).

12 Claims, 6 Drawing Sheets

(51) Int. Cl.
  *B65G 65/23* (2006.01)
  *B65G 65/32* (2006.01)
  *B65B 57/06* (2006.01)
  *B65B 25/00* (2006.01)
  *H05K 13/00* (2006.01)
  *B65B 15/04* (2006.01)

(52) U.S. Cl.
  CPC ........... *B65G 65/005* (2013.01); *B65G 65/23* (2013.01); *B65G 65/32* (2013.01); *H05K 13/0084* (2013.01); *H05K 13/021* (2013.01); *B65G 2201/047* (2013.01)

(58) Field of Classification Search
  USPC .................................... 414/405, 411; 221/82
  See application file for complete search history.

(56) References Cited

U.S. PATENT DOCUMENTS

| | | | |
|---|---|---|---|
| 4,456,154 A * | 6/1984 | Herriman | G03G 15/0875 141/363 |
| 4,491,161 A | 1/1985 | Tamura | |
| 4,615,461 A | 10/1986 | Liu | |
| 5,226,226 A | 7/1993 | Fierkens | |
| 5,263,517 A | 11/1993 | Ishikawa | |
| 5,390,472 A | 2/1995 | Weiler | |
| 5,454,900 A * | 10/1995 | Han | B29C 63/0013 156/765 |
| 5,778,282 A * | 7/1998 | Nagashima | G03G 15/0882 399/102 |
| 5,806,715 A | 9/1998 | Hamuro | |
| 6,272,298 B1 * | 8/2001 | Yamaguchi | G03G 15/0875 399/106 |
| 6,484,412 B1 * | 11/2002 | Donaldson | B44D 3/38 33/414 |
| 6,695,563 B1 * | 2/2004 | Guzman | B65B 3/04 141/129 |
| 10,065,813 B2 * | 9/2018 | Vander Hoek | B65G 65/23 |
| 10,246,237 B2 | 4/2019 | Popkin | |
| 2005/0191544 A1 | 9/2005 | Casanova | |
| 2008/0073349 A1 | 3/2008 | Ellswood | |

FOREIGN PATENT DOCUMENTS

| | | |
|---|---|---|
| DE | 102013219473 A1 | 3/2015 |
| DE | 102015013925 A1 | 7/2016 |
| EP | 0699021 A2 | 2/1996 |
| GB | 1384547 A | 2/1975 |
| GB | 2244689 A | 12/1991 |
| JP | S59-109199 U | 7/1984 |
| JP | H05-071188 U | 9/1993 |
| JP | H07-508251 A | 9/1995 |
| JP | H11-46088 A | 2/1999 |
| JP | 2007-525810 A | 9/2007 |
| JP | 2009-267297 A | 11/2009 |
| WO | WO 2016/166240 A1 | 10/2016 |
| WO | WO 2016166240 A1 | 10/2016 |

* cited by examiner

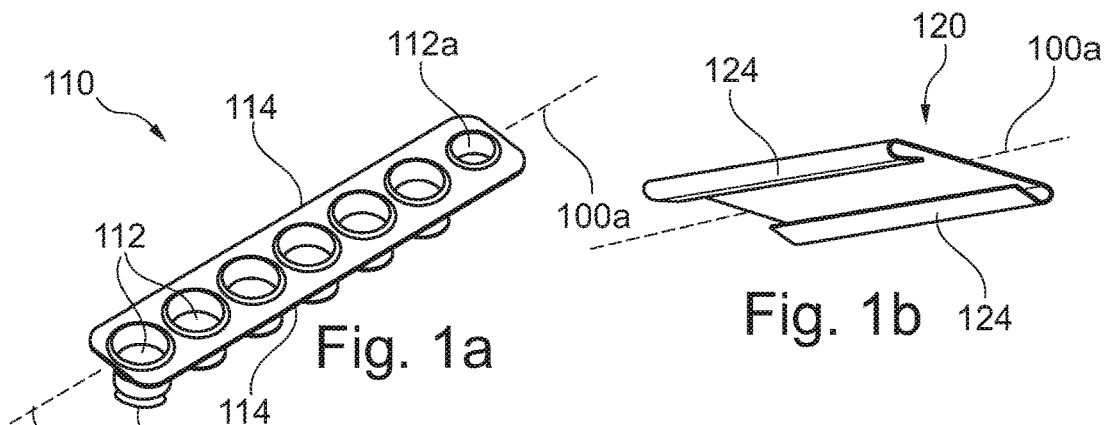
Fig. 1a
Fig. 1b
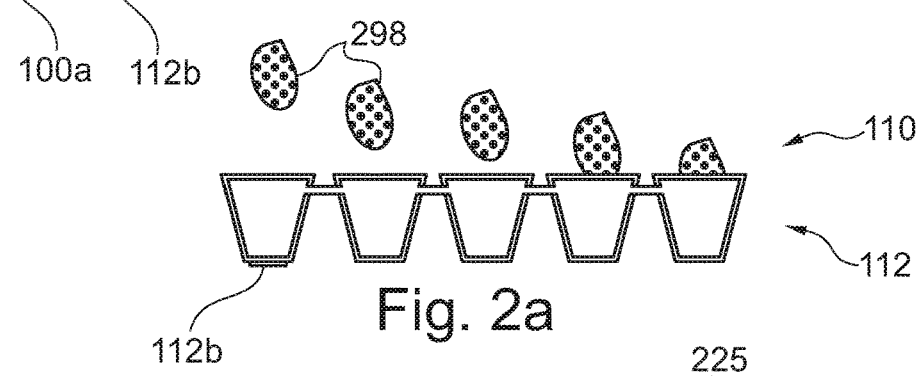
Fig. 2a
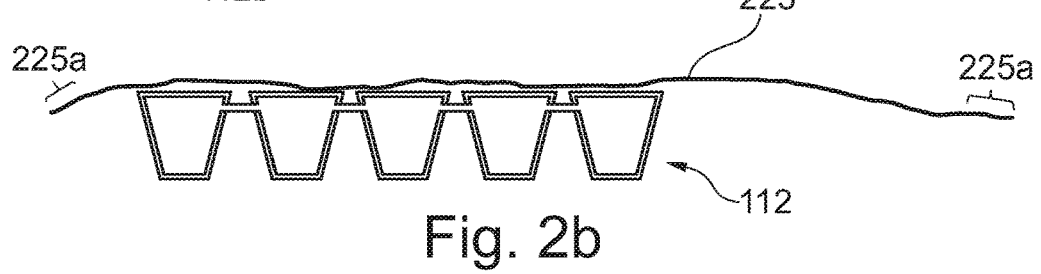
Fig. 2b
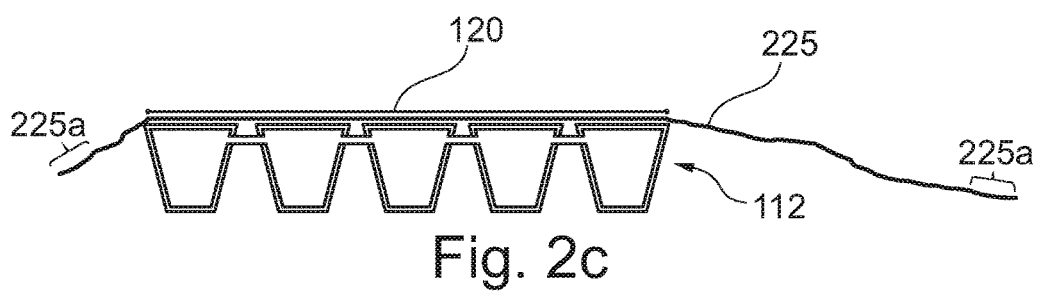
Fig. 2c
Fig. 2d

PORTION-WISE FILLING OF A RESERVOIR WITH BULK COMPONENTS

The present invention is a division of U.S. patent application Ser. No. 15/845,430, filed Dec. 18, 2017, which claims the foreign priority of German Patent Application No. 10206125495.9, filed Dec. 22, 2016 in the names of Thomas ROSSMANN, Stefan SEITZ, Norbert HEILMANN, Johannes JUSTINGER, Stefan MAGG, and Stefan GEIGER and entitled PORTION-WISE FILLING OF A RESERVOIR WITH BULK COMPONETS, the disclosures of which are incorporated by reference herein.

BACKGROUND OF THE INVENTION

Technical Field of the Invention

The present invention relates in general to handling components which are present in the form of bulk material for the purpose of a suitable portioning of the components. The present invention relates in general to a magazine for portion-wise receiving individualized electronic components which are present in bulk. Further, the present invention relates to a device for portion-wise transferring individualized electronic components which are present in bulk from a magazine in a reservoir of, or for, a component supply device for providing individualized components, particularly for providing individualized electronic components for the purpose of automatic assembly of component carriers in a placement machine. The present invention further relates to a method for portion-wise transferring individualized electronic components present in bulk from such magazine to a reservoir of, or for, a component supply device.

Background of the Invention

In automated assembly of component carriers with (electronic) components, the components to be processed are supplied to an assembly process, which typically is performed in a placement machine. The supply of the components takes place in a defined supply or pick-up position, from which they can be picked up by a placement head of the placement machine and can be placed in a predefined spatial position and orientation on the component carrier concerned.

In order to ensure reliable supply or providing of components, the components are usually packed in so-called component belts. These belts are then stepwise conveyed to the placement machine by means of a special component supply device, so that the components present in the component belt are conveyed sequentially to the supply or pick-up position. Packing components in such component belts is however complicated and also expensive. Further, the belt material must be processed as waste after removal of the components.

In order to avoid complicated packing and the above-mentioned waste problem, it is known to use so-called vibration transporters, which can individualise and transport the bulk components to be processed. Bulk components are usually stored in magazines. Depending on the size of the components, such a magazine can accommodate a large number of components. In handling, particularly in the case of transferring the components in a vibration transporter, care has to be taken that these components are delivered to the vibration transporter in a suitable amount and that no components are lost.

From document DE 10 2013 219 473 A1, a vibration transporter is known comprising a frame; a vibration device arranged to this frame and a transport device that can be mechanically coupled to the vibration device for transporting components by means of vibration from a storage magazine, which contains the components in the form of bulk material, into a preparation area. The transport device comprises (a) an accommodation device for the storage magazine, (b) a channel arrangement which extends between the accommodation device and the preparation area and which can be mechanically coupled to a vibration device; and (c) a closing element which is arranged in the channel arrangement and which can be moved between an opened position and a closes position. Only in the opened position, the channel arrangement is free to allow further components to be transported from the accommodation device to the staging area. When there are components in the staging area, they can be picked up by a placement head of an placement machine and be further processed in ordinary manner.

The channel arrangement known from the above-mentioned document DE 10 2013 219 473 A1 is a structure that is closed to the upper side, which only has a first opening at a first end directed to the accommodation device and a second opening at a second end directed towards the staging area. Therefore, the channel arrangement can also be indicated as a tunnel. Since in normal use there always are a plurality of electronic components in the channel arrangement and since further the transport device can be disconnected from the frame, the channel arrangement and therefore the entire transport device can also be considered as a reservoir for components, which can be stored for later use, for instance after a change of the type of components that are supplied with the vibration transporter.

Such reservoir must be filled from time to time with components from a (storage) magazine. Care has to be taken that on the one hand not too many components get lost when refilling from the (storage) magazine in the container and that on the other hand no undesired foreign particles are introduced into the container.

It is an objective of the present invention to enable a simple and reliable refilling of bulk components from a (storage) magazine into a container of a component supply device.

SUMMARY OF THE INVENTION

This objective is attained by the features of the independent claims. Advantageous embodiments of the present invention are described in the dependent claims.

According to a first aspect of the invention, a magazine is described for portion-wise receiving individualized and bulk electronic components. The magazine comprises (a) a receiving structure, comprising a plurality of closable receiving cavities, which are arranged along a longitudinal axis of the receiving structure, (b) a cover structure, which is arranged at the upper side of the receiving structure and displaceable along the longitudinal axis, so that (b1) in a closed position of the cover structure all receiving cavities are covered and (b2) in an opening position of multiple opening positions at least one receiving cavity is free; and (c) a closure foil which, in a form of closed belt, surrounds the cover structure along the longitudinal axis, wherein at least a part of the closure foil is releasably connected to the receiving structure.

The magazine described is based on the recognition that the bulk components are not only received or stored in a large receiving cavity or pocket, but in a plurality of somewhat smaller receiving cavities or pockets. The receiving cavities are, however, preferably still sufficiently large, so that a plurality of (small) components can be accommodated. For instance, in many embodiments, up to 500,000, up to 1,000,000, or even up to 1,500,000 small components (for instance so-called 0201 components) can be accommodated in a receiving cavity.

A further insight that forms the basis of the magazine according to the invention can be seen in that two different kinds of closures (closure foil and cover structure) are combined in such manner that an automatic opening of the package is enabled, wherein on displacing the cover structure with respect to the receiving structure a (further) receiving cavity is successively exposed. Thus, a controlled emptying of the magazine according to the invention with always a portion of the components contained in total is enabled in a simple and effective manner. In this case, a portion corresponds exactly to that number of components which can be or were contained in a receiving cavity.

Clearly expressed: when for example the cover structure is held at its side (at the edge where no closure foil is present) and the receiving structure is displaced with respect to the cover structure, then the cover foil rolls or slides around the (elongated) cover structure and is pulled from the receiving cavities lying thereunder. This means that the receiving cavities are opened by the movement of the cover structure with respect to the receiving structure or are released from the receiving structure, when the closure foil is pulled away in a soft, even and/or controlled movement.

This design principle of the magazine according to the invention makes it possible that, by means of a suitable driving, controlled automatically, the receiving structure can be moved with respect to the cover structure (with the closure foil arranged in encompassing manner) along the longitudinal axis. Thus, the individual receiving cavities or pockets can be opened in a controlled manner. In a mechanical device that is correspondingly suitably designed, such magazines can now be introduced and emptied into an arbitrary stock container such as for instance the reservoir described in the introductory part of this document.

Particularly in the case of large amounts of components taken out, it may be that the closure foil does not in each situation provide a sufficiently good mechanical protection (for example in the case of dispatching a filled magazine). Therefore, the closure foil, which overall is at least twice as long as the receiving structure (with the receiving cavities), is protected by the cover structure. After a (mechanical) connection of the closure foil on the receiving structure, the cover structure can be pushed on and protects the underlying closure foil and at the same time also the components present in the receiving cavities, against mechanical damage in an effective and reliable manner.

The phrase 'receiving structure' in this document can be understood as any three-dimensional and preferably elongated structure, which comprises the suitable receiving areas, in each of which a plurality of electronic components can be accommodated. The receiving structure may be implemented as one part or in multiple parts. In the case of a one part embodiment, the receiving cavities may be simple deformations or recesses in a carrier strip. In the case of a multi-piece embodiment, suitable pot structures containing the components may be arranged along the periphery of, for example, circular openings in a carrier strip. The receiving structure may be manufactured from a plastics material, at least partially but preferably in its entirety.

The phrase 'cover structure' can be understood as any three-dimensional structure which has a certain stiffness or robustness so that the closure foil can be wound around it and, with a relative displacing of the receiving structure and the cover structure, the endless tape of closure foil slides around this cover structure without significantly deforming it. Also the cover structure is preferably made from a plastics material.

The phrase 'closure foil' can be understood in particular as a thin strip which has high flexibility, so that it can be folded or laid around the longitudinal ends of the cover structure. Preferably, the closure foil comprises a material with a low expandability, so that in the case of 'sliding around' the cover structure the length of the endless tape does not, or only slightly, change. Also the closing foil may preferably be manufactured from a suitable plastics material. Suitable plastics materials may for instance be: polyethylene (PE) and/or polyethylene terephtalate (PET). Since the closure foil covers those receiving cavities or receiving pockets which are not exposed (by the cover structure), the closure foil can also be indicated as a cover foil.

According to an exemplary embodiment of the invention, along the longitudinal axis, two opposite end parts of the closure foil are connected to each other. This connection may be directly present in an overlapping region. Alternatively or additionally, it is also possible that an additional connecting strip indirectly connects the two ends of the closure foil to each other. The corresponding connection may particularly be obtained by means of adhesion, welding, or splicing.

Stated differently: the closed belt of the closure foil may in simple manner be manufactured in that the closure foil which at first is not yet closed, and has the form of an elongate strip arranged between the upper side of the receiving structure and the lower side of the cover structure, projects sufficiently far along the longitudinal axis at both sides of the cover structure. After folding both ends of the closure foil around a respective end edge of two end edges of the cover structure (particularly with a certain overlap), both ends can be connected firmly together, particularly adhered together either directly or indirectly. Preferably, the length of both projecting ends of the closure foil are such that they can be folded on the upper side of the cover structure and (just) overlap and can then be adhered together. After such adhesion, an endless strip around the cover structure is formed.

According to a further exemplary embodiment of the invention, in a starting condition of the magazine, the closure foil outside the receiving cavities is releasably adhered to the upper side of the receiving structure in a planar manner. This means that in said starting condition the individual receiving cavities are closed or covered by the closure foil. The planar adhered closure foil, in combination with the displaceable cover structure, furthermore provides an improved mechanical protection of the components accommodated. Apart from this improved mechanical protection, a closure foil or cover foil which is still only partly adhered with an only partly emptied magazine, may also be an optical indicator for the fact that a receiving cavity has either been opened already or is still originally closed, while after opening a sticky edge on the closing foil and/or on the receiving structure looks clearly different from an unopened receiving cavity.

With the phrase "starting condition" in this context a new condition of the magazine can be understood, in which the magazine is provided to a client by a component manufacturer, which client arranges the bulk components on the component carrier. As soon as at least one component is taken out of the magazine, at least one receiving cavity is at least partially opened, and as of this moment the magazine concerned is no longer in the starting condition.

According to a further exemplary embodiment of the invention, the receiving structure and the cover structure have at least approximately the same length along the longitudinal axis. This has the advantage that the magazine, without reducing the functionality, can be realized in a compact manner at least along the longitudinal direction.

According to a further exemplary embodiment of the invention, the receiving structure and the cover structure at both their side edges each have contours which are complementary to each other, and which are in engagement with each other perpendicular to the longitudinal direction. Because of this, in a structurally very simple manner, on the one hand a connection of the cover structure on the receiving structure can be made and on the other hand a readily obtainable relative sliding between the cover structure and the receiving structure can be ensured. At the same time, by the formation of the contours, the areas of the receiving cavities at the side edges can always advantageously be free from structures which allow the relative displacement. The two contours at each side may for example be tongue and groove contours or complementary contours of a dovetail-type guide.

According to a further exemplary embodiment of the invention, one of the two contours is a planar edge area of the receiving structure or the cover structure which is folded over preferably 180° perpendicular to the longitudinal axis and the other of the two contours is a flat edge area of the cover structure or receiving structure, wherein the folded planar edge area engages the flat planar edge area. This has the advantage that the engagement between receiving structure and cover structure can be realized in a particularly simple manner. This is particularly advantageous when the receiving structure and/or the cover structure are formed as one part, particularly from an appropriately-shaped plastics material or plastics strip. Preferably, the receiving structure and cover structure may be brought into mechanical engagement with each other in that they are displaced with respect to each other along the longitudinal axis in such manner that both flat contours can be displaced in the respective folded flat contours which are preferably folded over 180°.

It is noted that the contours which are involved in the attachment of the cover structure on the receiving structure may also be formed such that, for the purpose of attaching the cover structure to the receiving structure, they can simply be laid on top of each other at least approximately perpendicularly with respect to the longitudinal axis, that the one contour snaps in or on the other contour. This requires a certain elastic deformation of at least one of both contours involved. By a suitable spatial design of the contours, the attachment of the cover structure and receiving structure may be considerably simplified, especially for an operator.

A suitable design may for instance be realized in that an edge area is folded over clearly less than 180° and/or the folded edge area has a kink which is shaped more or less narrow. In such case, an upper part of the folded edge area serves to simplify a snap in that the contour which is at least partially complementary to the kinked edge area, in the case of attachment, slides along the side surface of the upper area and after "passing the kink" snaps into a lower portion (below the kink), which takes care of the actual form-closing connection between both (relatively displaceable) contours involved.

According to a further exemplary embodiment of the invention, the receiving structure and/or the cover structure comprises a marking, which is indicative for a type of component. When the magazine which is at least partly filled with the bulk components, it can always be ascertained which type of component is contained in the magazine. Consequently, erroneous assembly with wrong components can be avoided in an effective manner.

The marking may be any kind of structure which can be understood by a user or automatically by a reading device. Particularly, the marking may be an optically recognisable structure such as for instance a barcode or a matrix code and/or an RFID tag. The marking may be applied to the magazine in the form of a label or may be integrated in (a surface of) the receiving structure and/or the cover structure. A label may for instance be a self-sticking label. Such a self-sticking label may in the case of an embodiment described above also be used for connecting both end parts of the closure foil together in order to provide the closed tape.

According to a further exemplary embodiment of the invention, a non-central receiving cavity of the plurality of receiving cavities has a different shape and/or a different size with respect to at least one of the other receiving cavities. Such asymmetry with respect to the receiving cavities has the advantage that, with a magazine accommodating device that is formed in a suitable and geometrically complementary manner, insertion of the magazine is only possible in a predefined direction. Consequently, a partly emptied magazine may, when the components concerned are no longer required for a certain assembly task, remain further in the magazine and may be used again at a later moment when these components are required again for a further assembly task. In such intermediate storage of the components, the closure foil may if desired be used to temporarily close an only partly emptied receiving cavity.

According to a further exemplary embodiment of the invention, a device is described for portion-wise transferring individualized bulk electronic components (i) from a magazine which has multiple closable receiving cavities along a longitudinal axis, in each of which a plurality of electronic components are stored, (ii) into a reservoir for a component supply device for providing individualized components, particularly for provided individualized electronic components for the purpose of automatic assembly of component carriers in an placement machine by means of vibration. The magazine is particularly a magazine of the above-described type. The device comprises (a) a frame; (b) a holding device mounted on the frame for holding the reservoir stationary, wherein the reservoir is oriented in such manner that a filling opening of the reservoir is located on the upper side with respect to gravity; (c) a magazine receiving device mounted on the frame for receiving the magazine in such orientation that components which are located in a receiving cavity fall down into the filling opening under the influence of gravity upon opening of the receiving cavity.

The device described is based on the recognition that a controlled transfer of electronic components into the reservoir can take place by using gravity. One only has to take care that the receiving cavity concerned is spatially positioned with respect to the filling opening such that the receiving cavity is above the filling opening without any horizontal offset. To this end, the magazine-receiving device may comprise a centring element or cooperate with such centring element, which ensures that the reservoir is aligned with the position of the receiving cavity concerned at least along a horizontal direction.

In order to make the filling process of the components even more secure, it is also possible to provide a funnel for the components falling down. This funnel may be a component of the reservoir and/or a component of the transfer device described, arranged on the frame. When the funnel is a component of the reservoir, the transfer device may be designed such that the components only contact the magazine and the reservoir and not the device itself. In this manner, a "contamination" with foreign components can be avoided advantageously, in as far as the device described is used for filling different types of components (from different magazines in different reservoirs).

The magazine mentioned may be a magazine of the type described above with reference to various exemplary embodiments.

According to a further exemplary embodiment of the invention, the device further comprises a turning device, which connects the magazine receiving device with the frame and which is formed such that the magazine receiving device is movable between a receiving position and a withdrawal position, wherein (i) in the receiving position the magazine in the magazine receiving device can be brought in an orientation in which openings of the receiving cavities are on top, and (ii) in the withdrawal position the received magazine has a turned orientation, particularly around 180°.

The turning device particularly has the advantage that the magazine can be inserted or laid into the magazine receiving device in a simple manner. To this end, the magazine may exclusively be handled in an upright orientation and may particularly in the receiving position be inserted in an upright orientation particularly by an operator. In the withdrawal position of the turning device, the magazine receiving device is then turned together with the magazine, so that upon exposing the opening of a receiving cavity, the components concerned fall down.

The turning device may comprise a hinge attached to the frame and a holding frame attached to the hinge. In this manner, the holding frame can be swivelled with respect to the frame. The magazine receiving device may be mounted directly or indirectly on the holding frame. Preferably, the magazine receiving device is indirectly mounted on the holding frame via a carrier element that is displaceable along the longitudinal axis. In such case, the holding frame can provide, possibly while using a suitable rail structure, a longitudinal guide for the carrier element to which the magazine receiving device is arranged.

The holding frame may also be indicated as tilt frame. The displaceable carrier element may also be indicated as a sledge, which is borne on the rail structure running parallel to the longitudinal axis.

Only for sake of precaution it is noted that a controlled filling of the reservoir is also possible without the above-described turning device. However, without the turning device, an operator must take care that the magazine is already introduced 'upside-down', i.e. with the openings of the receiving structure or the receiving cavities directed downwards.

According to a further exemplary embodiment of the invention, the device further comprises a holding-down device, arranged on the turning device and movable between an opening position and a closing position and designed (i) in the opening position, to allow an insertion of the magazine into the magazine receiving device and (ii) in the closing position, to hold the magazine in the magazine receiving device. This has the advantage that, in the case of displacing the magazine receiving device between the receiving position and the withdrawal position, the magazine remains safely in the magazine receiving device.

Preferably, the holding-down device is arranged pivotably to the components of the turning device, particularly to the above-described holding frame, so that it can be displaced to and from between the opening position and the closing position by a simple swinging movement. If these components of the turning device or the above-described displaceable carrier element, respectively, are pivotably mounted on the frame, the holding-down device is mounted on the frame, so to say, 'doubly pivotable'. A pivotable arrangement in both cases has the advantage that this can be realized mechanically simply and at the same time ensures a high positioning accuracy with respect to the receiving position and the opening position, respectively, as well as the withdrawal position and closing position, respectively.

According to a further exemplary embodiment of the invention, the device comprises a displacing device which is adapted to displace at least one receiving structure of the magazine along the longitudinal axis in order to sequentially open the receiving cavities.

In case the magazine is realized in the above-described configuration (comprising the receiving structure as well as a cover structure), the displacing device, possibly in connection with further mechanical components such as the holding-down device described in this document, may be implemented in such manner that, when activating the displacing device, the cover structure or the entire magazine is first displaced until a defined stop and after reaching the defined stop only the receiving structure is displaced further along the longitudinal axis. In other words, the cover structure is prevented by the stop from displacing further along the longitudinal axis. In this manner, the receiving structure is displaced away under the cover structure that is fixed along the longitudinal axis, so that the receiving cavities, which originally are covered at least by the cover structure, and the corresponding components will be transferred from the respectively exposed receiving cavity into the reservoir held on the frame.

In the case of displacing the receiving structure with respect to the cover structure that is positioned with fixed location or temporarily fixated to the frame, the components preferably fall down at one side of the cover structure. In this manner, the position of the components falling down is accurately defined along a direction parallel to the longitudinal axis.

In a simple but effective embodiment, the displacing device comprises a spindle drive so that an accurate displacing of the receiving structure can be achieved by a simple turning of the spindle. The spindle drive can be self-breaking, for instance by a suitable slight increase of the spiral structure on the outer wall of the spindle. This has the advantage that, even when a motor of the spindle drive is not powered, any undesired displacing of the receiving device, for instance by an operator, is excluded.

According to a further exemplary embodiment of the invention, the displacing device comprises a driver element that is displaceable with respect to the frame parallel to the longitudinal axis, which driver element is in engagement with a carrier element of the turning device that is displaceable along the longitudinal axis, wherein the carrier element is configured to hold the receiving structure of the magazine.

The mechanical coupling between the driver element of the displacing device and the carrier element of the turning device allows a simple assembly of the device described.

The displaceable carrier element may also be indicated as a sledge, guided by a rail structure running parallel to the longitudinal axis.

According to a further exemplary embodiment of the invention, the driver element and an engagement element of the carrier element are in engagement independently from the position of the turning device. This has the advantage that the carrier element and also the magazine, in as far as the magazine is in or at the receiving structure, which is again fixedly connected to the carrier element, are always in a defined position with respect to a coordinated system of the frame. In this manner, the defined position is defined by the actual position of the displacing device or more accurately by the actual position of the driver element.

The expression 'independently from the position of the turning device' in this context may be understood in that the driver element and the engagement element are not only in engagement with each other when the magazine receiving device is in the receiving position or in the withdrawal position by a corresponding position or positioning of the turning device. Engagement between driver element and engaging element is present also when the turning device and hence also the carrier element are in corresponding intermediate positions.

The engagement element may be any mechanical structure that can be engaged by the driver element. For instance, the engagement element may be a pin projecting from a foundation plate of the carrier element.

According to a further exemplary embodiment of the invention, the device further comprises a blocking mechanism that is formed such that a displacing of the carrier element by means of the displacing device is exclusively possible when the magazine receiving device is in the withdrawal position. This has the advantage that a simultaneous displacing of the carrier element and moving or swinging of the turning device is prevented. In this manner, the movements of the carrier element and the turning device are disconnected from each other and the number of states in which the device described can be in is correspondingly reduced. On the one hand, this makes control of the device described easier. On the other hand, operational safety of the device described is increased.

The blocking mechanism may particularly be designed such that a movement of the turning device is only then possible when the displacing device is in its starting position, in which the carrier element or the magazine receiving device is in a position in which the magazine can be inserted into or withdrawn from the device described. In this manner, unhindered insertion of the magazine into the magazine receiving device can always be ensured.

According to a further exemplary embodiment of the invention, the device further comprises an operational condition determination system, which preferably is mounted on the frame and which is designed to recognize at least one of the following conditions:

(a) a marking is arranged on the magazine, which indicates that the components in the magazine are of same type as the components that are to be transferred into the reservoir.

(b) The magazine receiving device is in the receiving position.

(c) The magazine receiving device is in the withdrawal position.

(d) The holding-down device is in the opening position.

(e) The holding-down device is in the closing position.

The operational condition determination system described has the advantage that different operational conditions of the device for portion-wise transferring can be identified. Depending on the actually identified operational condition, different functions or functionalities of the device described may be activated or deactivated. In this manner, high operational safety of the transfer device described can be ensured.

By way of example, it is possible that an actuation of the turning device and consequently a transition of the magazine receiving device between the receiving position and the withdrawal position is only then possible when the holding-down device is in the closing position and/or the components residing in the magazine are of a predetermined type.

The operational condition determination system may at least comprise a suitable sensor and a processing unit coupled to the at least one sensor for suitably processing the sensor data in order to determine the information concerned with respect to the operational condition of the device.

The marking on the magazine may be an optically recognisable marking. Alternatively or in combination the marking may also comprise a so-called RFID-tag. Sensors for determining the positions of the magazine receiving device or turning device, respectively, and/or holding-down device may be known optical, magnetic and/or electrical sensors.

According to a further exemplary embodiment of the invention, the device further comprises a reservoir determination system, which is preferably mounted on the frame and which is arranged to recognize at least one of the following conditions:

(a) A reservoir is held by the holding device.

(b) The reservoir held by the holding device is in a predetermined position.

(c) The reservoir held by the holding device comprises a marking indicative that the reservoir is a predetermined reservoir.

The reservoir determination system described has the advantage that, also with respect to the reservoir to be filled, a high operational safety can be ensured and that it can be prevented that a wrong reservoir is erroneously used, which is filled with the components residing in the magazine. On the other hand, it can be prevented that a reservoir is filled with wrong components. In this manner, it is ensured that, in the case of a subsequent applying of electronic components to component carriers, always the correct electronic components are supplied to the application process by a vibration transporter.

Also the reservoir determination system can have suitable sensors with a processing unit coupled thereto, which processes the sensor data in a suitable manner in order to obtain the information concerned with respect to the present position and/or identity of the reservoir to be filled. Also in this case, further operation or activation or deactivation of functionalities of the device may be made depending on which items of information are obtained with the reservoir determination system.

According to a further exemplary embodiment of the invention, the device further comprises an actuator, which is mounted on the frame and which is positioned and adapted such that a shutter of a reservoir held by the holding device can be displaced between a first position and a second position, wherein (i) in the first position the reservoir is opened, so that the reservoir can be filled with components, and (ii) in the second position the reservoir is closed, so that no components can enter into the reservoir or can exit it. This has the advantage that a reservoir to be filled can only be opened when it is in the holding position predetermined by the holding device. Stated differently, the shutter of the reservoir can be always closed except for the timeframe in which filling takes place. In this manner, on the one hand it can be prevented that components fall down from the reservoir even if the reservoir is handled without care, and on the other hand penetration of dirt (particles) into the reservoir can be prevented.

The closure of the reservoir may also be located in or at a funnel-shaped portion of the reservoir, wherein the funnel portion, as already described above in conjunction with the funnel, can be provided for the purpose of ensuring a reliable transfer of falling components into the reservoir and an at least approximate avoidance of loss of components.

According to a further exemplary embodiment of the invention, the holding device cooperates with the actuator and is configured such that inserting the reservoir into the holding device and withdrawing the reservoir from the holding device is only possible when the shutter of the reservoir is in the second position. Consequently, it can be ensured in automatic manner that in the case of handling the reservoir outside the device described, components fall out from the reservoir and/or undesired particles such as for instance dirt particles or components of another type penetrate into the reservoir and contaminate it.

According to a further aspect of the invention, a method is described for portion-wise transferring of individualized bulk electronic components (i) from a magazine of the above-described type (ii) into a reservoir for a component supply device. In this method, a device of the above-described type is used. The method comprises (a) attaching the reservoir to the holding device; (b) receiving the magazine at the magazine receiving device; (c) displacing the receiving structure of the magazine relative to the cover structure of the magazine, so that one receiving cavity of the plurality of receiving cavities is opened; and (d) transferring components from the at least partially opened receiving cavity into the reservoir under gravity.

Also the method described is based on the recognition that bulk electronic components present in a receiving cavity of a magazine can be transferred into a reservoir of a component supply device or into a reservoir for a component supply device, respectively, while utilising gravity.

According to an exemplary embodiment of the invention, the method further comprises moving the magazine receiving device together with the received magazine from a receiving position into a withdrawal position, wherein the received magazine (i) in the receiving position is in an upright orientation and (ii) in the withdrawal position is in a turned orientation, particularly in an orientation turned around 180°. Displacing the receiving structure relative to the cover structure is performed in the turned orientation of the magazine.

Turning the magazine as described before the withdrawal of the components by gravity has the advantage that handling the magazine, particularly by an operator, can be easier in that the magazine outside the described device can always be handled in its upright orientation and can also be placed into the magazine receiving device in its upright orientation. Turning the introduced magazine with a turning device of the described device can then take place in automatic or at least semi-automatic manner, wherein all handling steps which are taken when the magazine is in the described device can, thanks to the advantageous construction of the device, be taken with a very high operational safety.

It is noted that embodiments of the invention have been described with reference to different inventive features. Particularly, some embodiments of the invention have been described with device claims and other embodiments of the invention have been described with method claims. However, the person skilled in the art, when reading the present application, will immediately recognize that, as far as not indicated differently explicitly, apart from a combination of features belonging to one type of inventive feature, also an arbitrary combination of features is possible belonging to different types of inventive features.

Further advantages and features of the present invention will appear from the following exemplary description of presently preferred embodiments. The individual figures of the drawing of this document are only schematic and are not to be understood as true-to-scale.

BRIEF DESCRIPTION OF THE DRAWING

FIGS. 1*a* and 1*b* show the receiving structure and the cover structure, respectively, of a magazine for portion-wise retrieving individualized bulk electronic components.

FIGS. 2*a*-2*d* illustrate filling of the receiving structure with electronic components (FIG. 2*a*) and the application of an endless tape of a closure foil around the cover structure (FIGS. 2*b*-2*d*).

DETAILED DESCRIPTION

Figure 3A:
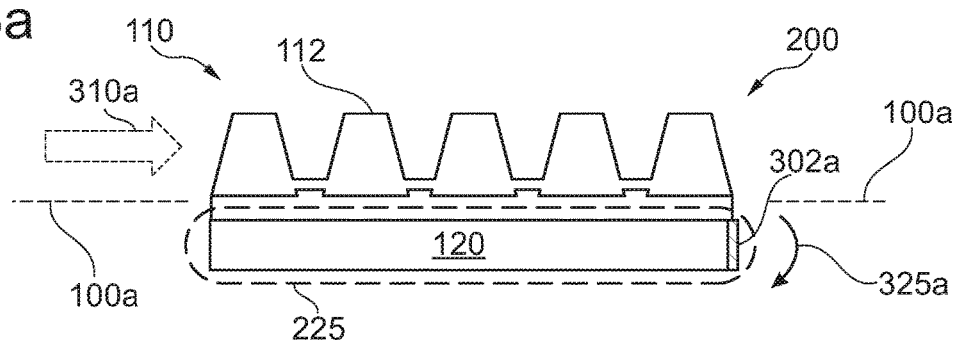
FIGS. 3*a* and 3*b* illustrate opening of the receiving cavities of the receiving structure by displacing the receiving structure (FIG. 3*a*) or displacing the cover structure (FIG. 3*b*).

It is noted that in the following detailed description features or components, respectively, of different embodiments, which are equal or at least equal in function with corresponding features or components, respectively, of another embodiment, are indicated with the same reference numerals or with reference numerals which, as far as the last two characters are concerned, are identical to the reference numerals of correspondingly equal or at least equal in function features or components. In order to avoid unnecessary repetitions, features or components, respectively, which have already been explained with reference to an earlier described embodiment will not be explained in detail at a later place anymore.

It is further noted that the embodiments described hereinafter only show a limited choice of possible variations of embodiments of the invention. It is particularly possible that features of individual embodiments are combined together in suitable manner so that with the variations of embodiments explicitly shown here a plurality of different embodiments are to be considered as clearly disclosed to a person skilled in the art.

Further it is noted that concepts which relate to space, such as for instance before' and 'behind', 'above' and 'below', 'left' and 'right', etcetera, are used to describe the relationship of one element with respect to another element or with respect to other elements as visible in the figures. Consequently, these concepts relating to space may apply for orientations that differ from orientations shown in the figures. It should however be obvious that all these concepts relating to space for the sake of simplicity of description only relate to the orientations shown in the drawings and are not necessarily limiting, since the corresponding device, components etcetera as shown, when it is in use, can take orientations which may be different from the orientations shown in the drawing.

FIGS. 1a and 1b show two components of a magazine for portion-wise receiving individualized electronic components that are present in bulk. A first one of the components shown in FIG. 1a is a receiving structure 110. The second component shown in FIG. 1b is a cover structure 120.

The receiving structure 110 comprises a planar (plastics) material in which multiple receiving cavities 112, 112a are formed along a longitudinal axis 100a. In the exemplary embodiment shown, in total seven of such receiving cavities are present, wherein six receiving cavities 112 have a same form and size and a seventh receiving cavity 112a has a smaller size, particularly a smaller diameter. At the bottom side of a receiving cavity 112a marking 112b is arranged, which is indicative of the magazine and/or the type of the electronic components contained in the magazine. In the case of the exemplary embodiment shown here, this marking by way of example is a barcode. The receiving cavities 112, 112a are so small in comparison to the width of the entire receiving structure 110 that there are two planar edge areas 114 present to the left and to the right of the longitudinal axis 100a.

The cover structure 120 is a 'plastics' strip that is formed elongate along the longitudinal axis 100a, of which the side edges are folded down, so that a folded edge area 124 results in each case. When the cover structure 120 cooperates with a receiving structure 110, the two planar edge areas 114 are taken into engagement by the two turned edge areas 124. The cover structure 120 remains displaceable with respect to the receiving structure 110 along the longitudinal axis 100a.

FIG. 2a illustrates filling of the receiving structure 110 of a magazine 200 with electronic components 298. In comparison to a usual component belt, in which always only one electronic component is accommodated in a so-called belt pocket, in the case of the magazine 200 a plurality of relatively small electronic components 298 are stored in each receiving cavity.

FIGS. 2b-2d illustrate arranging an endless tape of a closure foil around the cover structure 120. As can be seen from FIG. 2b, a closure foil 225 or cover foil 225 is first laid over the receiving cavities 112, 112a filled with electronic components. Here the length of the closure foil 225 is chosen such that in FIG. 2b two relatively long tape portions of the closure foil 225 project away from the receiving structure 110 to the left hand side and to the right hand side of the receiving structure 110. This results in two end portions 225a, which are clearly outside the longitudinal extent of the receiving structure 110. After this, as can be seen in FIG. 2c, the cover structure 120 is placed on the closure foil 225. Here, the (lower side) of the closure foil 225 adheres to a sticky surface of the receiving structure 110, so that the electronic components 298 filled in the corresponding receiving cavities 112 are closed in.

According to the exemplary embodiment shown here, (along the longitudinal axis 100a) the cover structure 120 is exactly as long as the receiving structure 110. Further, the cover structure 120 is placed flush on the receiving structure 110 (along the longitudinal axis 100a). As can be seen from FIG. 2d, both tape portions extending beyond the receiving structure 110 are then folded such that both end portions 225a can be adhered together. Consequently, a closed tape of closing foil 225 is made, which tape is wound around the cover structure 120.

In the case of the exemplary embodiment of the invention described here, a primary closure of the receiving cavities 112 thus takes place in a manner very similar as with known component belts by means of a stuck-on foil. This foil, indicated here as closure foil 225, has the function to protect the components against falling out, against dirt and/or against humidity. The stuck-on closure foil 225 does however not provide sufficient mechanical protection in all situations (for instance in the case of a mailing), particularly in the case of large amounts of electronic components. This, too, is a reason for the magazine 200 having the cover structure 120 described. The closure foil 225, which has at least twice the length in comparison to the length of the receiving structure 110 or the length of the cover structure 120, is as a matter of fact protected by the cover structure 120.

A further substantially more important function of the displaceable cover structure 120 is however to be seen in that the endless belt of the closure foil 225 is wound around this cover structure 120. When now for instance the cover structure 120 is held sideways at its side edges 124, where no closure foil 225 is lying, and at the same time the receiving structure 110 is displaced along the longitudinal axis 100a, then the closure foil 225 rolls around the cover structure 120 and is thus successively pulled away from the receiving cavities 112 lying thereunder. This means that the receiving cavities 112 lying thereunder are opened by the movement of the cover structure 120 with respect to the receiving structure 110, in that the closure foil 225 is pulled away in an accurately controlled manner by a soft movement.

Figure 3B:
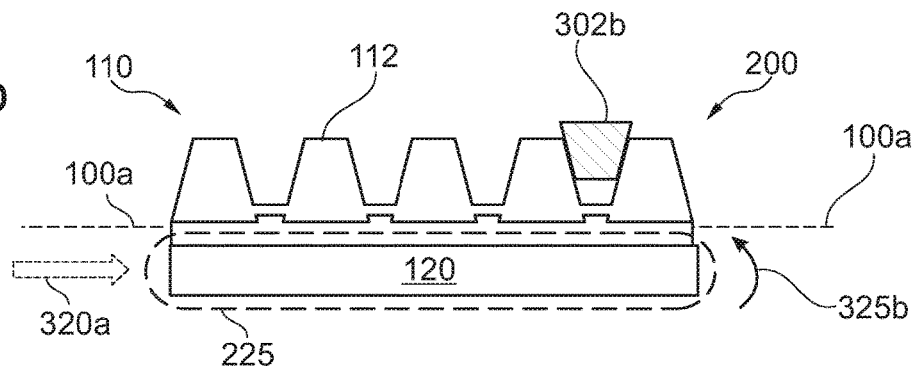

FIGS. 3a and 3b illustrate opening of the receiving cavities 112 of the receiving structure 110. The receiving structure 110 is in a 'upside-down' orientation, so that on opening of a receiving cavity 112 the components contained in this receiving cavity 112 fall down. It is clear that a relative displacement between receiving structure 110 and cover structure 120 can be achieved in two ways. Either the cover structure 120 is fixed in space and the receiving structure 110 is displaced along the longitudinal axis 100a or the receiving structure 110 is fixed in space and the cover structure 120 is displaced along the longitudinal axis 100a.

Fixing of the cover structure 120 by means of a stop element 302a, which can also be indicated as front stop, and a displacing of the receiving structure 110 along a displacing direction 310a, is indicated in FIG. 3a. A direction of movement of the closure foil 225 around the cover structure 120 is illustrated by the bent arrow 325a.

Fixing of the receiving structure 110 by means of a stop element 302b engaging between two receiving cavities 112 and a displacing of the cover structure 120 along a direction of displacement 320a is shown in FIG. 3b. The corresponding direction of movement of the closure foil 225 around the cover structure 120 is illustrated with a bent arrow 325b.

The basics described here of a controlled detaching of the closure foil 225 from the upper side of the receiving structure 110 by a controlled relative movement between the receiving structure 110 and the cover structure 120 can be realized by a suitable drive for the receiving structure 110 or the cover structure 120. With this, individual receiving cavities 112 can be opened in a controlled and purposeful manner. In a correspondingly constructed mechanical device, such magazines can now be introduced and can be automatically emptied in an arbitrary reservoir. Further, the marking 112b for the magazine 200 mentioned above and shown in FIG. 1a can, by a suitable identification of the marking for instance by means of a barcode reader, be used to ensure that with such device a reservoir is only filled with the prescribed correct components.

Stated differently, in the magazine 200 described here, two closure principles are combined with each other in such a manner to enable an automatic opening of the magazine 200 and a controlled emptying of individual receiving cavities 112 of the magazine 200. By combining the adhered closure foil 225 with the displaceable cover structure 120, an increased mechanical protection as well as an improved identification of the contents of the receiving cavities 112 is achieved, wherein the upper side of the cover structure 120 is used for corresponding labels. Such labels can also be used to adhere together both end portions 225a of the closure foil 225 shown in FIG. 2a and FIG. 2b. The cover foil 225 can further, in the case of an only partly emptied magazine 200, also be an optical indicator to determine whether the receiving cavity 112 has already been opened or alternatively is still originally packed, because after opening the corresponding sticky edge looks clearly different as compared to a still unopened receiving cavity 112 of the receiving structure 110.

Figure 4A:
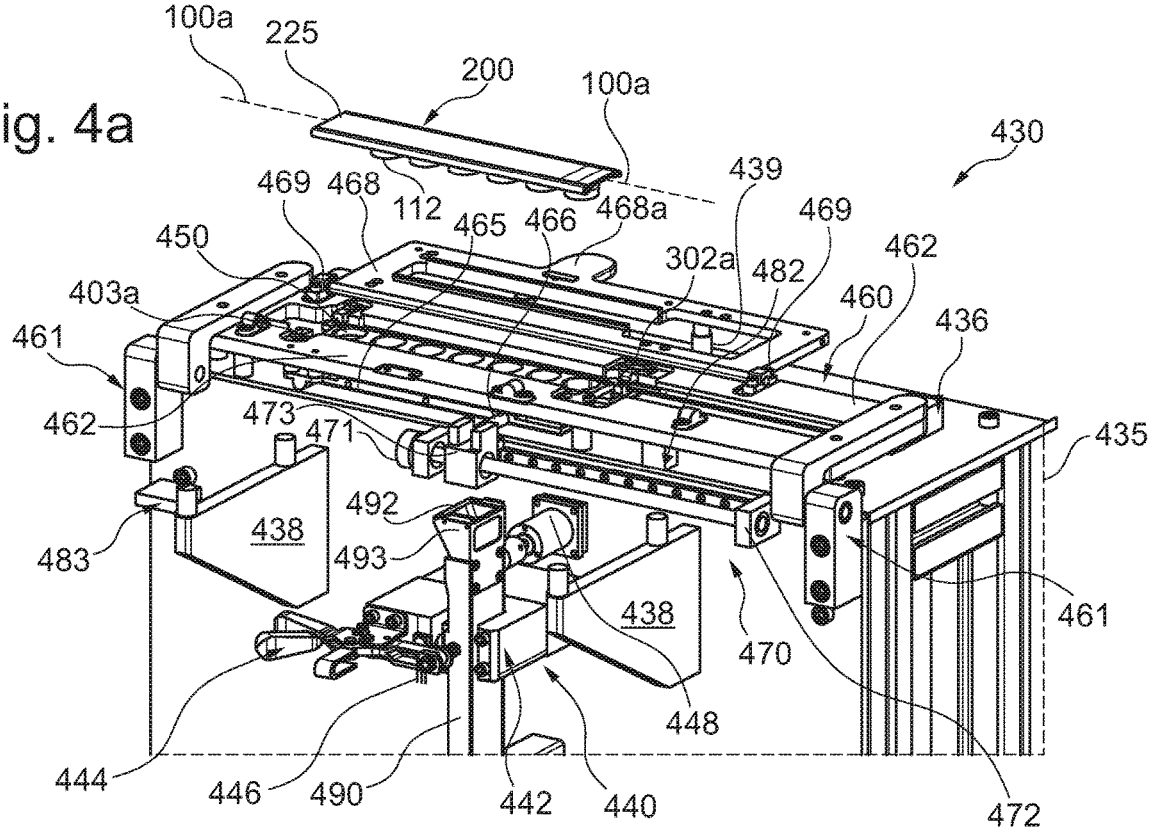
FIG. 4*a* shows a device for portion-wise transferring bulk electronic components from a magazine in a reservoir for a component supply device, wherein the device is in an operational condition in which the magazine can be inserted.

Corresponding to an exemplary embodiment of the invention, FIG. 4a shows a device 430 for portion-wise transferring bulk electronic components from a magazine 200 into a reservoir 490 for a component supply device (not shown). The device 430, which will in this document also be indicated as transfer device, is shown in FIG. 4a in operative condition in which the magazine 200 has not (yet) been introduced but can be introduced.

The transfer device 430 comprises a frame 435 which provides a frame structure for various functional components of the transfer device 430. A holding device 440 is attached to a side of the transfer device 430 which in FIG. 4a is the front side, which holding device 440 comprises a holding jaw 442 as well as a clamping mechanism 444. The holding device 440 is implemented such that the reservoir 490 to be filled is held in a fixed spatial position. For fixing the reservoir 490 in this position, the clamping mechanism 444 is provided, which according to the exemplary embodiment shown here comprises a mechanism with a grip for an operator as well as a clamping lever.

In order to at least partially automate filling of the reservoir 490 and consequentially ensure a high process safety when filling components from the magazine into a reservoir 490, the transfer device 430 comprises a sensor 446 which shows whether the reservoir 490 is present or not. Preferably, this sensor also recognizes the type of the reservoir 490 to be filled, so that in case of a wrong reservoir, filling of this reservoir can be avoided.

According to the exemplary embodiment shown here, an actuator 448 is further provided at the side wall of the transfer device 430 which in FIG. 4a is the front side wall, which actuator cooperates with a shutter of the reservoir not shown in FIG. 4a, in such a manner that this shutter is only opened on activation of the actuator 448 and so that only then filling of the reservoir 490 is possible. In the case of the embodiment shown here, this shutter is located in the area of a filling funnel 493, which increases the effective size of a filling opening 492 of the reservoir 490, so that electronic components falling down from above can reliably enter the reservoir 490. Preferably, this shutter is only opened for a short period when the electronic components are just to be introduced into the reservoir 490 in the transfer device 430. Time-wise outside this filling process, this shutter is closed, so that, even when the reservoir 490 is handled not very carefully, on the one hand falling out of the electronic components is reliably avoided and on the other hand a contamination of the reservoir 490 with dirt particles and/or with strange electronic components is reliably avoided.

The transfer device 430 further comprises a turning device 460, which at an upper side of the transfer device 430 is mounted on the frame 435. According to the exemplary embodiment shown here, the turning device 460 comprises a holding frame 462, which is pivotably attached to the frame 435 via a hinge 461. Because of this pivotability, the holding frame will in this document also be indicated as folding frame 462. In the operative condition shown in FIG. 4a, the turning device 460 is in a receiving position, in which the magazine 200 can be accommodated in a starting orientation, wherein the closure foil 225 is above with respect to gravity and in which the receiving cavities 112 are below with respect to gravity.

A displaceable carrier element 465 is mounted to the holding frame 462, (below, in the folded-in condition shown), which carrier element will in this document also be indicated as a sledge. A magazine receiving device 450 is introduced in the displaceable carrier element 465 or is detachably attached thereto. The magazine receiving device 450 has a spatial structure which is complementary to the (lower side of) the receiving structure 110 of the magazine 200. The magazine 200 can be inserted accurately into this magazine receiving device 450.

A holding-down device 468 is pivotably mounted to the upper side of the holding frame 482 via a hinge 469. In FIG. 4a, this holding-down device is shown in an opened position. This means that the magazine 200 can be introduced. Furthermore, multiple structural elements are attached to the upper side of the holding frame 482, which ensures that the position of the cover structure 120 of the magazine 200 stays spatially fixed or limited along the longitudinal axis 100a. Two stop elements 302a are provided at the front side of the cover structure 120 or the magazine 200, respectively (to the right-hand side in FIG. 4a), which stop elements are also schematically shown in FIG. 3. To the rear side of the cover structure 120 or the magazine 100, respectively (to the left-hand side of FIG. 4a), two limitation elements 403a are provided, which according to the exemplary embodiment shown here, do not only limit the position of the cover structure 120 but, particularly on introduction of the magazine 200, also the position of the receiving structure 110 (to the left hand upper side in FIG. 4a).

After introduction of the magazine 200, the holding-down device 468 is tilted at a holding grip 468a by an operator, so that the magazine 200 and particularly the cover structure 120 of the magazine 200 is fixed between the holding frame 462 and the holding-down device 468, which is then closed.

Figure 4B:
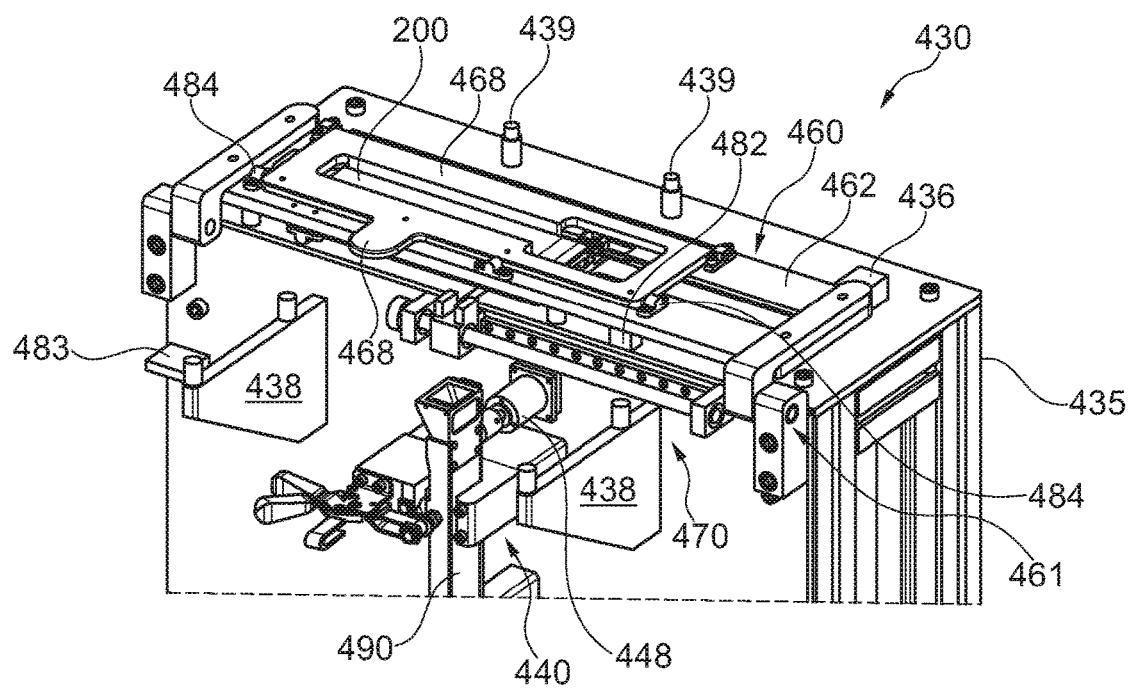
FIG. 4*b* shows the device with introduced magazine and closed holding-down device.

FIG. 4b shows the transfer device 430 with introduced magazine 200 and closed holding-down device 468. Two ball pressure pieces 484 serve to lock the holding-down device 468 in its closed position. Support pens to the upper side of the frame 435 serve to hold the holding-down device 438 in a defined (horizontal) angular position when it is in its opening position.

Furthermore, a support structure 438 for the tilting device 460 can be recognized in FIG. 4b. This support structure 438 serves to hold the holding frame 462 in a defined (preferably horizontal) angular position when the tilting device 460 is in the withdrawal position. Further, the transfer device 430 comprises (a) a sensor 482 which serves to recognize whether the tilting device 460 is in its receiving position and (b) a sensor 483 which serves to recognize whether the tilting device 460 is in its withdrawal position.

Further, the transfer device 430 comprises a displacing device 470, which can best be recognized in FIGS. 4a and 4b and whose function will hereinafter be described in more detail with reference to FIG. 4c. According to the exemplary embodiment shown here, the displacing device 470 is realized as a so-called spindle drive, which comprises a rotation motor 471, a spindle rotatably borne and driven by the rotation motor 471, as well as a driver element 473 that is displaceably borne and displaceable along the spindle axis by the spindle 472. The spindle axis runs parallel to the longitudinal direction 100a (see in particular FIG. 1a).

Figure 4C:
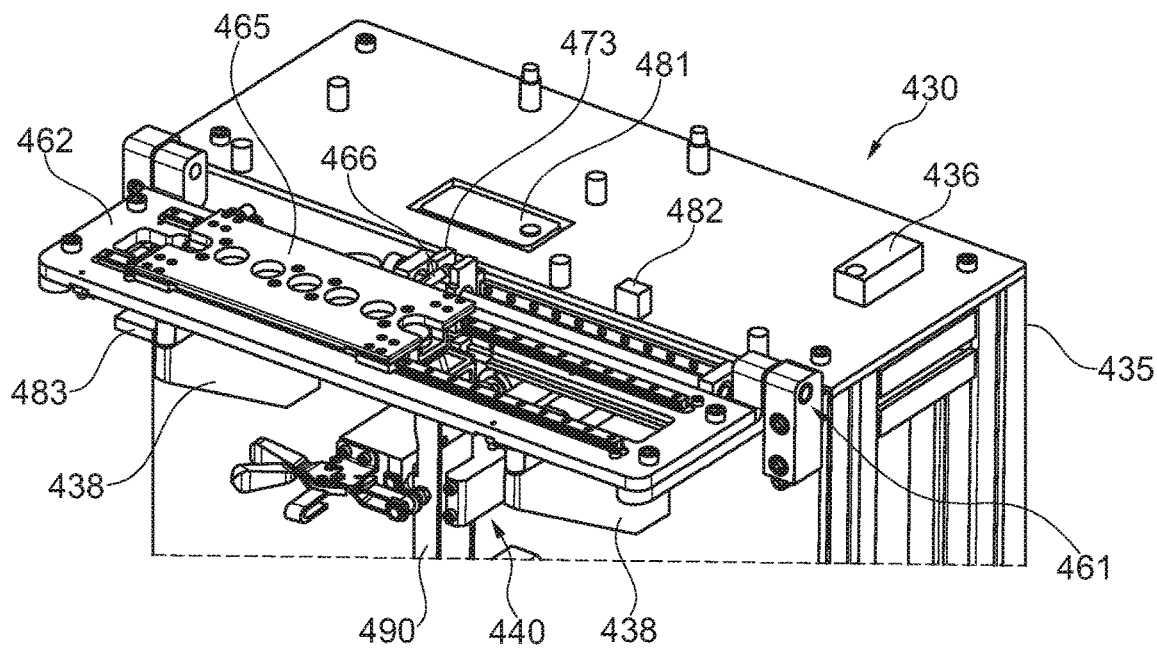
FIG. 4*c* shows the device in an operational condition in which the magazine has been turned over 180° by means of a turning device.

FIG. 4c shows the transfer device 430 in an operative condition in which the magazine has been turned by the turning device 460 over 180°. Also an ID scanner 481 can be recognized, which according to the exemplary embodiment shown here is implemented as a barcode reader. The barcode reader 481 serves to verify the identity of the magazine 200 particularly in view of the electronic components located therein, before the transfer device 430 can be taken in operation. In this way, it can be ensured that wrong electronic components are not inadvertently introduced into the reservoir 490.

The displacing device 470 already mentioned above serves to displace the displaceable carrier element 465 in such a manner that the receiving structure 110 of the magazine 200, which receiving structure 110 is in direct or indirect mechanical engagement with the carrier element 465, to be displaced, wherein the cover structure 120 of the magazine 200 because of the stop elements 302a mentioned above remains in place with respect to the frame 435. In this manner, the relative displacement between receiving structure 110 and cover structure 120, which has been described in detail above, is realized. This relative displacement takes care for sequentially opening of the receiving cavities 112.

As can best be seen in FIG. 4c, an engagement element 466 ensures that the displaceable carrier element 465 is in engagement with the driver element 473. According to the exemplary embodiment shown here, there is always engagement between the driver element 473 and the engagement element 466 of the carrier element 465, even during folding of the holding frame 464. This avoids a manual displacement of the displaceable carrier element 465. Because of a self-locking of the spindle drive of the displacement device 470, respectively, the displaceable carrier element 465 cannot be (manually) moved anymore, even in the case of power failure.

Further, in FIG. 4c also an unlocking actuator 436 of the transfer device 430 can be recognized. This unlocking actuator 436 ensures that the folding frame 462 can only be pivoted out of the receiving position of the turning device 460 when the holding-down device 468 is in its closing position (with introduced magazine 200).

Figure 5A:
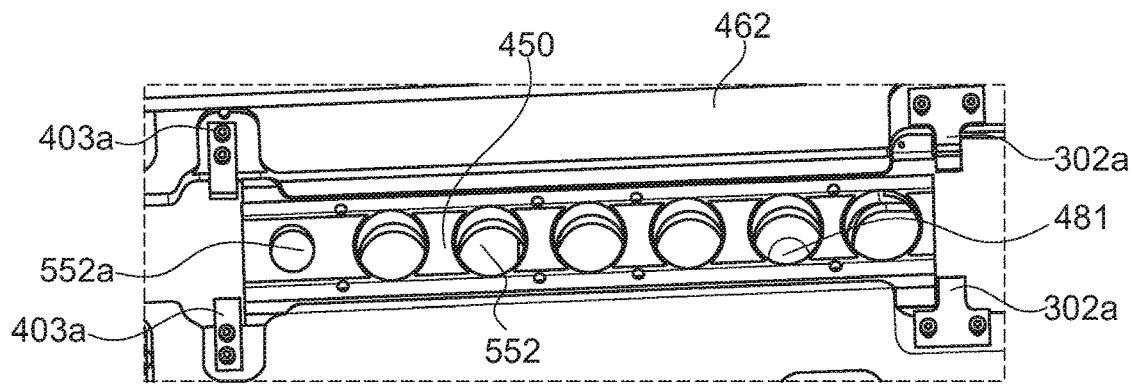
FIG. 5*a* shows in a top-view a magazine receiving device located in a holding frame and in the operational condition shown in FIG. 4*a*, in which the magazine can be inserted.

FIG. 5a shows a top-view of a magazine receiving device 450 located in the holding frame 462 in the operative position shown in FIG. 4a. The holding-down device 468 (not shown) is opened, so that the magazine (also not shown) can be inserted without hindrance. Also, both stop elements 302a as well as both limitation elements 403a, which already ensure a suitable positioning of the receiving structure 110 and/or the cover structure 120 on insertion of the magazine 200, can also be recognized very well.

As can also be seen from FIG. 5a, the magazine receiving device 450 comprises a hole structure, which is complementary to the shape and position of the receiving cavities 112 of the receiving structure 100. The hole structure comprises, according to the exemplary embodiment shown here, six openings 552 which are assigned to the 'large' receiving cavities 112, as well as a smaller opening 552a, which is assigned to the 'small' receiving cavity 112a (see FIG. 1a). This asymmetry of the magazine receiving device 450 (and a corresponding asymmetry of the receiving structure of the magazine to be inserted), ensures in a simple and effective manner that the magazine can only be inserted in a correct orientation. That is to say, when the magazine is inserted with a wrong orientation, in the case of the exemplary embodiment shown here, the holding-down device 468 cannot be closed or can only be closed with force.

The position of the magazine on introduction is determined by the stop elements 302a, which form front limitation elements, as well as by the 'rear' limitation elements 403a. Later, on emptying the magazine, the front stop elements 302a have the function of holding the cover structure but nonetheless allow a movement of the receiving structure.

Figure 5B:
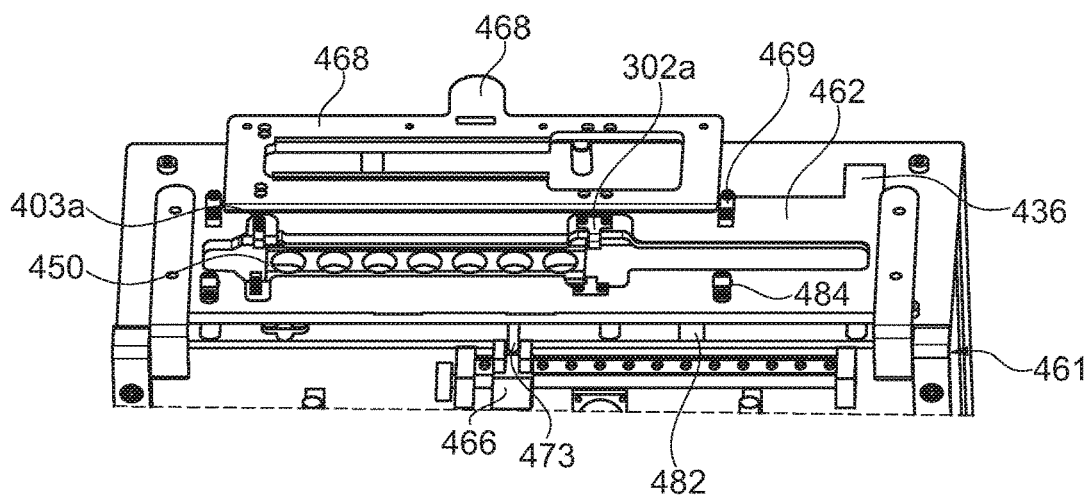
FIG. 5*b* shows the holding frame together with the opened holding-down device.

FIG. 5b shows the holding frame 462 together with the opened holding-down device 468.

According to the exemplary embodiment shown here, the transfer device 430 is configured such that, after a displacement of the carrier element 465, the foldable holding frame 462 or the turning device 460 are automatically blocked. Only when the carrier element 465 is later brought back to its starting position, the foldable holding frame 462 is released again. Such blocking can for instance take place via a suitable latching element (for instance a sprung latch, lever or hook), which is pressed away by the displaceable carrier element 465 when this is in its starting position.

Figure 5C:
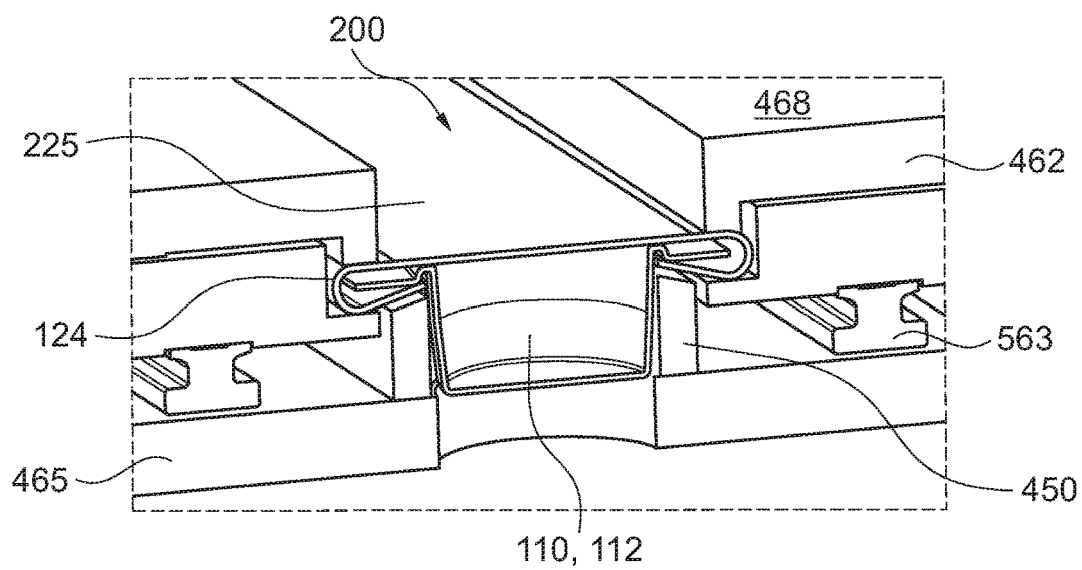
FIG. 5*c* shows in cross-section the magazine that is placed in the magazine receiving device and fixed by the holding frame as well as by the holding-down device, wherein the receiving structure of the magazine is in engagement with the displaceable carrier element.

FIG. 5c shows, in a cutaway view, the magazine 200, which has been inserted into the magazine receiving device 450 and is fixed by the holding frame 462 as well as by the holding-down device 468. The receiving structure 110 of the magazine 200 is taken into engagement by the displaceable carrier element 465. A rail structure 536 ensures that the displaceable carrier element 465, moves (translationally) relative to the holding frame 462, due to the displacing device 470 described above, softly and without large friction losses.

Stated clearly, the magazine 200 in its inserted condition is clamped by the holding-down device 468 or held in position with a small clearance. The "folded" side edges 124 of the cover structure are held upwardly and downwardly by corresponding clamping faces of the holding frame 462 and the holding-down device 468, respectively. These clamping faces are not moved during transport of the receiving structure 110. Thus, the cover structure also remains spatially fixed when the receiving structure 110 has been completely emptied. In order later to enable of the receiving structure 110 to be closed again by a return displacement of the cover structure, the receiving structure 110 is never displaced completely out (of engagement with) the cover structure. Further, a recess in the holding-down device 468 ensures that the closing foil 225 is not obstructed when "running around" the cover structure.

According to the exemplary embodiment shown here, the sensor 482, which for example can be a distance sensor, has a dual function. On the one hand, it recognizes that the holding-down device 468 has been correctly closed and that the foldable holding frame 462 is in the upper position (the turning device 460 is in the receiving position). To this end, a so-called switching flag can be present on the holding-down device 468, which allows the sensor 482 to recognize that the holding-down device 468 is in its closing position. The said switching flag may for instance reach through an opening (not shown) in the holding frame 462 as far as the sensor 482.

When the holding frame 462 is in the lower or folded position, respectively (the turning device 430 is in the withdrawal position), this is recognized by the sensor indicated with reference 483 in FIG. 4c. In this position of the holding frame 462, the holding-down device 468, in the exemplary embodiment shown here, is mechanically blocked through a stop, so that the holding-down device 468 cannot be opened and accordingly an undesired withdrawal of the "upside-down" oriented magazine is not possible.

According to the exemplary embodiment shown here, when the foldable holding frame 462 is in the upper position (the turning device 430 is in the receiving position), the holding frame 462 is automatically mechanically locked. In this position, an electric locking of the holding frame 462 is of course also possible. A corresponding suitable mechanical locking mechanism can for instance be a snapper, functioning similarly to a common door lock. Only when introduction of a correct magazine is verified by the ID scanner, this locking mechanism can be opened again through an actuator not shown (for instance a motor or a lifting magnet). Only then can the foldable holding frame be pivoted again.

Figure 6A:
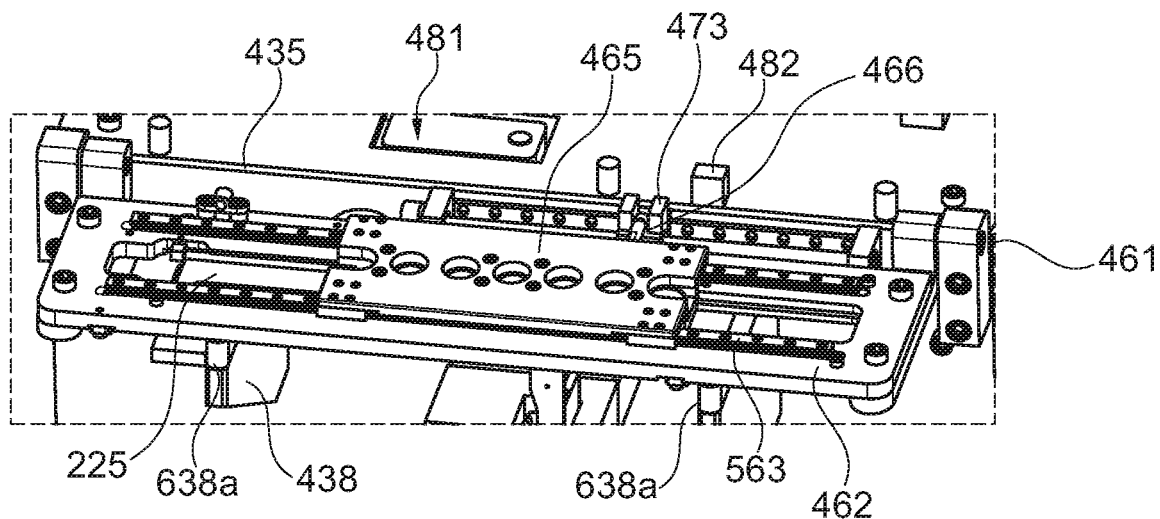
FIG. 6*a* shows an enlarged view of the turning device, which is in the withdrawal position in which the magazine is oriented 'upside-down'.

FIG. 6a shows, on a larger scale, the turning device 460 which is in the withdrawal position. The foldable holding frame 462 lies on the support structure 438. Spacer elements 638a of the support structure 438 ensure that the holding frame 462 is lying well and securely. The magazine, of which only the lower bottoms of the receiving cavities 112 can be seen, is oriented "upside-down" in comparison to its orientation which it had on insertion into the transfer device 430.

Figure 6B:
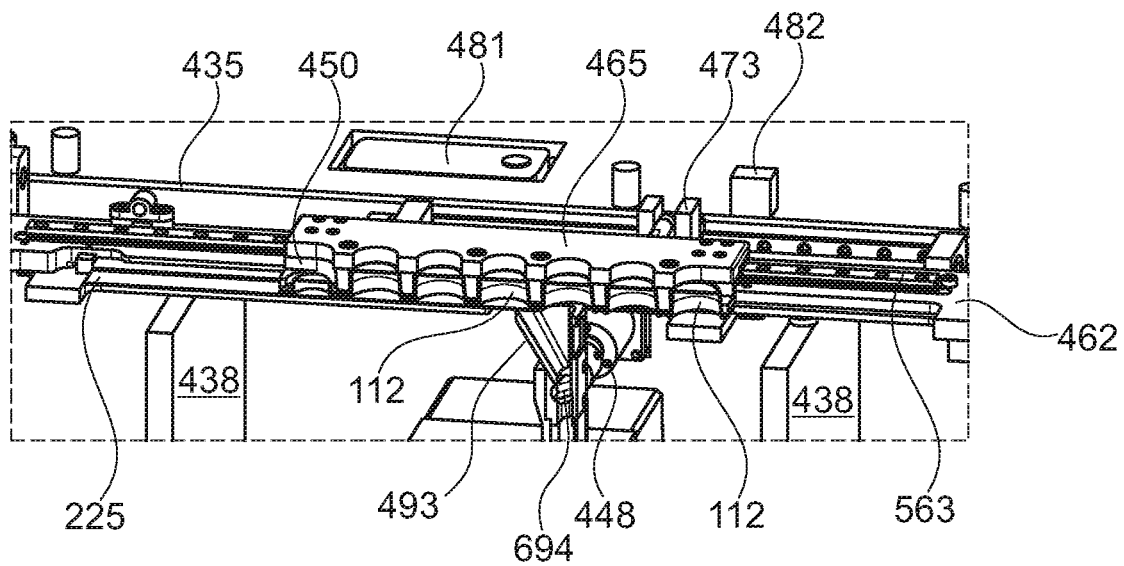
FIG. 6*b* shows in cross section the 'upside-down' oriented magazine in a condition in which components not shown are removed from one of the receiving cavities down to the funnel of a reservoir.

FIG. 6b shows, in a sectional view, the "upside-down" oriented magazine in a condition in which components (not shown) can be emptied from one of the receiving cavities 112 downwards into the funnel 493 of the reservoir 490. Preferably, the components fall out at a front edge of the receiving cavity 112, which is defined by the "turning" position of the closure foil 225 on the corresponding front edge of the cover structure. This position corresponds with the "right hand edge" of the closure foil 225 in FIG. 6b.

In the embodiment shown here of the reservoir 490, a closure element 694 is provided, which can be actuated by the actuator 448 described above. In a first opened position of the closure element 694, penetration of components into the reservoir 490 is possible. In a second closed position of the closure element 694, the reservoir 490 is closed, so that, as already described above, alien contamination of the inner area of the reservoir 490 is not possible.

A closure shaft of the closure element 694 can for instance only be moved with a special toolbit, associated with the actuator 448. This toolbit can be implemented for cooperation with the closure element 694 according to the key-lock principle, so that the reservoir 490 can only be removed from the holding device 440 (see FIG. 4a) in a closed position of the closure element 694.

Figure 7:
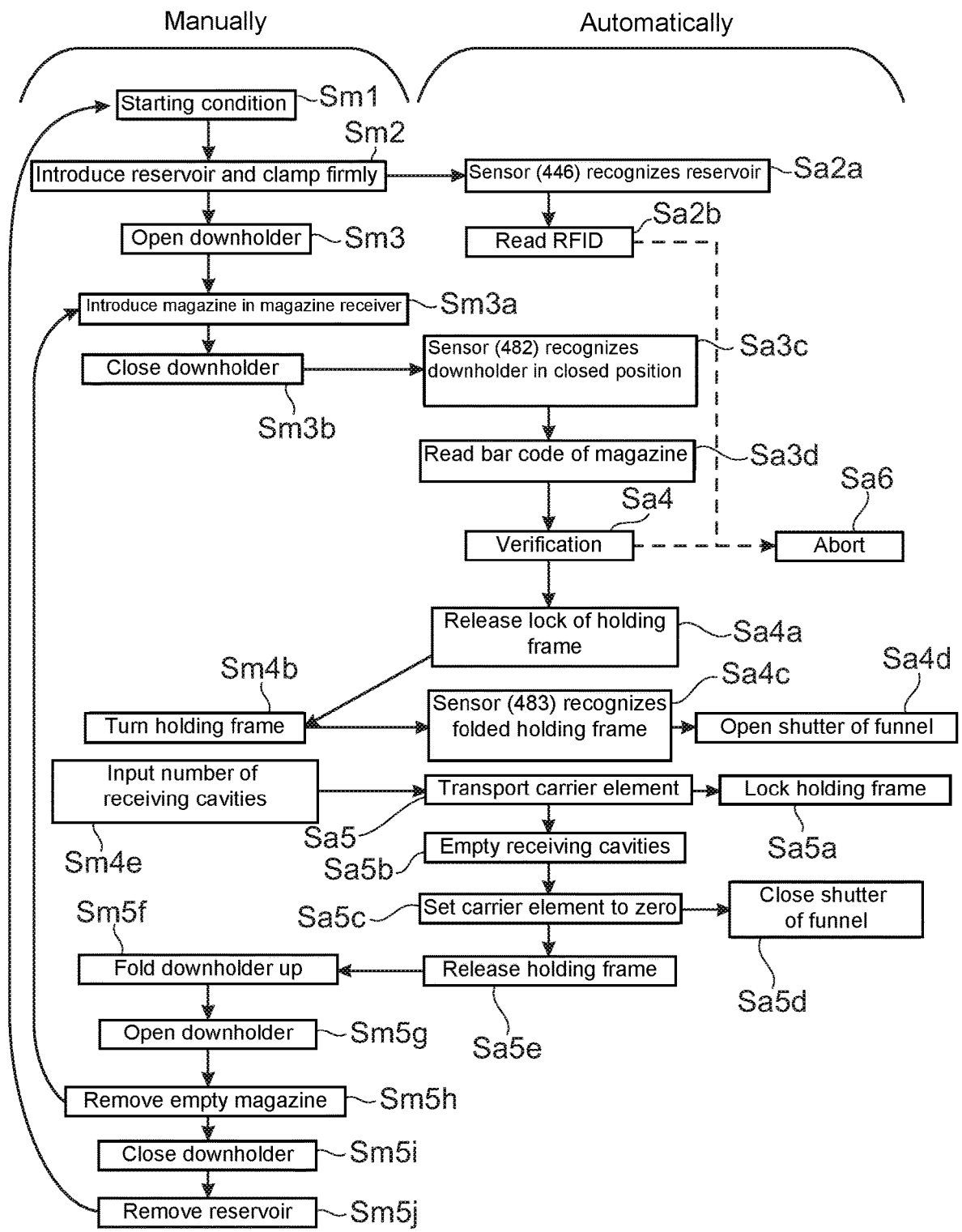
FIG. 7 shows a flow-diagram of a process for semiautomatic filling of a reservoir with electronic components.

FIG. 7 shows in a flow diagram a procedure for semi-automatic filling of the reservoir 490 with electronic components. To the left-hand side in FIG. 7, process steps are shown that, according to the exemplary embodiment shown here, are performed manually (by an operator). At the right-hand side, steps are shown which, according to the exemplary embodiment shown here, take place automatically.

First, the transfer device 440, which in this document is illustratively also referred to as a refill station, is in a starting situation indicated with reference numeral Sm1 in the flow diagram. In this starting situation, neither a magazine 200 is inserted, nor a reservoir 490 is received, by the holding device 440. The holding frame 462 is in its upper position, which as set out above is indicated as the receiving position of the turning device 460. Furthermore, the holding-down device 468 is closed, that is to say it is in the closing position mentioned above. Further, the sensor 482 is covered by the holding frame 462 as well as by the holding-down device 468, so that it detects the starting condition of the refill station 430.

In order to execute the component refill process, in a first step Sm2 the reservoir 490 is introduced into the holder or holding device 440 provided for that purpose, and firmly clamped with the clamping mechanism 444. By the correct position of the clamping mechanism 440, the sensor 446 is caused to output a positive verification signal, which is necessary for the further continuation of the process described here for filling the reservoir 490 with electronic components.

In a next step Sa2b, the ID scanner detects a marking in the form of an RFID tag, which is arranged on the reservoir 490 and which is indicative for the type or even for the identity of the reservoir 490. Alternatively or in combination, the marking can also indicate how many electronic components are still contained in the reservoir 490. When the examination of the reservoir 490 does not lead to a positive result, the refill process is aborted (compare block Sa6).

In a next step Sm3, the holding-down device 468 is opened. This allows in a next step Sm3a, that a magazine 200 which fits the reservoir 490, particularly in view of the type of the electronic components to be filled, is inserted into the magazine receiving device 450. In this case, the receiving cavities 112, 112a are introduced in the openings 552, 552a provided. In a next step Sm3b, the holding-down device 468 is closed again. In a next step Sa3c, a correct closing of the holding-down device 468 is recognized by the sensor 482 (together with the position of the turning device 460 or the holding frame 462, in the withdrawal position).

For an efficient process of automatically filling the reservoir 490, it is necessary that the magazine 200 is introduced in the correct orientation. This is ensured by the asymmetry described above in this document with respect to shape and/or size of the receiving cavities 112, 112a and the corresponding openings 552, 552a, respectively. An optional adhesive strip or an adhesive-comprising overlap between both end portions 225a of the closure foil 250 is arranged at the end of the cover structure 120, by which both ends of the closure foil 225 are connected with each other above the cover structure 120 (so that a closed band results). As a result, the corresponding adhesive joint does not need to be moved around the (sharp) end of the cover structure 120. Otherwise, the pull-away forces required for releasing the closure foil 225 from the (sticky) receiving structure 110 would increase too much and the closed belt of the closure foil 225 could rupture. For this reason, the magazine 200 is 'coded' by the above-described asymmetry, so that the process described here for refilling electronic components takes place only when the magazine 200 has been inserted in the correct orientation.

According to the exemplary embodiment shown here, this coding takes place by two features. On the one hand, the mechanical dimensions of the receiving structure 110 are implemented in such manner that the magazine 200 can only be inserted without force in one direction into the openings 552, 552a provided for that purpose. Should the magazine 200 be clamped in the wrong orientation, the holding-down device 468 cannot reach its intended end position and the sensor 482 is not triggered. On the other hand, it is also possible to determine whether the magazine 200 has been inserted in the correct orientation by means of the 2D barcode 112b at the underside of the receiving structure 110.

After activation of the sensor 482 in a step Sa3c, according to the exemplary embodiment shown here, in a next step Sa3d reading of the 2D barcode 112b at the lower side of the receiving structure 110 is performed by the ID scanner 481. The barcode 112b contains information on the type of the components contained in the magazine 200, the filled quantity of components and/or other information such as, for example, a numbering of the receiving cavities 112.

After that, in a next step Sa4, a verification takes place (for example through a data processing device with connected databank), whether the type of the electronic components to be filled and the reservoir 490 match. If this is not the case, should the reservoir 490 already be full or if the reservoir 490 has been removed in the meantime (sensor 446 open), then the refill process is aborted or interrupted, until all requirements have been fulfilled (see block Sa6). This is the case when the sensors 446 and 483 trigger or provide a positive sensor signal, and a magazine 200 with the correct components has been inserted. When all conditions are met, then in a step Sa4a a locking of the foldable holding frame 462 is released and the holding frame 462 can be folded in a step Sm4b.

When the holding frame 462 is in the lower or folded position, then the sensor 483 is covered (see step Sa4c) and the closure element 694 of the filling funnel 493 is opened for refilling (see step Sa4d). In this position, the holding-down device 468 is mechanically blocked, so that no inadvertent opening of the holding-down device 468 can take place.

During the refill process, the operator concerned is guided through the process of refilling of electronic components by suitable graphical displays. At the latest after folding down, the operator must, in a step Sm4e, input the number of receiving cavities 112, 112a that should be emptied in the refill process concerned. In this context it is possible to have emptied only individual receiving cavities 112, 112a or the entire magazine 200. Through control of the filling condition of electronic components it can be ensured that the reservoir 490 is not overfilled.

After activation by the operator, the actual automatic emptying of the magazine 200 takes place. For that purpose, in a step Sa5, the displaceable carrier element 465 is displaced or transported. The distance to be travelled corresponds in this case with the number or the numbering, respectively, of the receiving cavities 112, 112a to be emptied. After that, in a step Sa5a, the holding frame 462 is immediately blocked, so that folding upwards of the holding frame 462 during emptying of components is reliably prevented. Emptying the respective receiving cavities 112, 112a, which is effected by displacing the carrier element 465, is shown in the flow diagram in a block indicated with Sa5b. In this procedure, according to the exemplary embodiment shown here, as already described above, the receiving structure 110 is displaced with respect to the spatially fixed cover structure 120. As a result, the receiving structure 110 and the cover structure 120 separate and the closure foil 225 adhered on the receiving structure 110 is pulled away. The receiving cavities 112, 112a are opened above the filling funnel 493 and a kind of 'waterfall' results at that side of the cover structure 120 at which the components 'trickle' into the filling funnel 493. The velocity of the displaced carrier element 462 is chosen such that the components are securely transferred into the filling funnel 493 and do not fall beyond.

After emptying the receiving cavities 112, 112a, the carrier element 465 returns to its starting position in a step Sa5c. In a step Sa5d, the closure element 694 in the filling funnel 493 is then closed again and in a step Sa5e the holding frame 462 is released again. In a next manual step Sm5f, the holding frame 462 is folded upward again and consequently locks automatically. After opening the holding-down device 468 in a step Sm5g, in a next step Sm5h the empty magazine 200 can be removed together with the pushed-in receiving structure 110. Now a new magazine that is to be emptied for filling the reservoir 490 can be inserted and a new refill process started, as illustrated by the arrow connecting blocks Sm5g and Sm3a.

Alternatively, in a step Sm5i, the holding-down device 468 is closed and the reservoir 490 removed in a next step Sm5j. Thereby, the refill process is completed and the starting position (see block Sm1) is established again. This restoration of the starting position is illustrated by the arrow connecting block Sm5j with block Sm1.

It is to be noted that the term 'comprise' does not exclude other elements and that 'a' does not exclude a plurality. Further, elements that have been described in conjunction with different exemplary embodiments can be combined. It should also be noted that reference numerals in the claims are not to be interpreted as limiting the scope of the claims.

REFERENCE NUMERALS

100a Longitudinal axis
110 Receiving structure
112 Receiving cavities
112a Receiving cavity with different shape
112b Marking/barcode
114 Side edge/planar edge area/contour
120 Cover structure
124 Side edge/folded edge area/complementary contour
200 Magazine
225 Closure foil/cover foil
225a End portions
298 Components
302a Stop element for cover structure/front stop
302b Stop element for receiving structure
310a Displacing direction receiving structure
320a Displacing direction cover structure
325a Direction of movement of closing foil
325b Direction of movement of closing foil
403a Limitation element
430 Transfer device/refill station 435 Frame
436 Unlocking actuator
438 Support structure
439 Support pen
440 Holding device
442 Holding jaw
444 Clamping mechanism/clamping lever
446 Sensor (presence of reservoir)
448 Actuator (for lock of reservoir)
450 Magazine receiving device
460 Turning device
461 Hinge
462 Holding frame/folding frame
465 Displaceable carrier element/sledge
466 Engagement element
468 Holding-down device
468a Holding grip
469 Hinge
470 Displacing device
471 Rotation motor
472 Spindel
473 Driver element
481 ID Scanner
482 Sensor (for turning device in receiving position)
483 Sensor (for turning device in withdrawal position)
484 Ball pressure piece
490 Reservoir
492 Filling opening
493 Funnel/filling funnel
552 Opening
552a Opening with different shape
563 Rail structure
638a Spacer element
694 Lock/locking element
Sm1 Starting condition
Sm2 Emptying reservoir and clamping firmly
Sa2a Sensor (446) recognizes reservoir
Sa2b Read RFID of magazine
Sm3 Opening holding-down device
Sm3a Inserting magazine in magazine receiving device (within limitations)
Sm3b Closing holding-down device
Sa3c Sensor (482) recognizes holding-down device in closed position
Sa3d Read barcode of magazine
Sa4 Verification magazine
Sa4a Release locking of holding frame
Sm4b Turning around holding frame
Sa4c Sensor (483) recognizes turned around holding frame
Sa4d Open shutter of funnel
Sm4e Introduce number of receiving cavities
Sa5 Transport of carrier elements
Sa5a Lock holding frame
Sa5b Emptying of receiving cavities
Sa5c Set carrier element in position zero
Sa5d Close shutter of funnel
Sa5e Release holding frame
Sm5f Fold holding frame upwards
Sm5g Open holding-down device
Sm5h Remove empty magazine
Sm5i Close holding-down device
Sm5j Remove reservoir
Sa6 Abort

What is claimed is:

1. A device for portion-wise transferring individualized bulk electronic components
   (i) from a magazine which has multiple closable receiving cavities along a longitudinal axis, in each of which a plurality of electronic components are stored,
   (ii) into a reservoir for a component supply device for providing individualized components for the purpose of automatic assembly of component carriers in a placement machine by means of vibration, the device comprising:
   a frame;
   a holding device mounted on the frame for holding the reservoir stationary, wherein the reservoir is orientated in such a manner that a filling opening of the reservoir is located on the upper side with respect to gravity; and
   a magazine receiving device mounted on the frame for receiving the magazine in such orientation that components which are located in a receiving cavity fall down into the filling opening under influence of gravity upon opening of the receiving cavity;
   a turning device which connects the magazine receiving device with the frame and which is formed such that the magazine receiving device is movable between a receiving position and a withdrawal position, wherein
     (i) in the receiving position, the magazine can be inserted into the magazine receiving device in an orientation in which openings of the receiving cavities are on top, and
     (ii) in the withdrawal position, the received magazine has a turned orientation.

2. The device according to claim 1, wherein in the withdrawal position, the received magazine has a turned orientation around 180°.

3. The device according to claim 1, further comprising:
   a holding-down device which is arranged on the turning device and movable between an opening position and a closing position and which is designed in the opening position, to allow insertion of the magazine into the magazine receiving device and in the closing position, to hold the magazine in the magazine receiving device.

4. The device according to claim 1, further comprising: a displacing device which is adapted to displace at least one receiving structure of the magazine along the longitudinal axis in order to sequentially open the receiving cavities.

5. The device according to claim 4, wherein the displacing device comprises a driver element that is displaceable with respect to the frame parallel to the longitudinal axis, which driver element is in engagement with a carrier element of a turning device that is displaceable along the longitudinal axis wherein the carrier element is configured to hold the receiving structure of the magazine.

6. The device according to claim 5, wherein the driver element and an engagement element of the carrier element are in engagement independently from the position of the turning device.

7. The device according to claim 5, further comprising: a blocking mechanism that is formed such that a displacing of the carrier element by means of the displacing device is exclusively possible when the magazine receiving device is in the withdrawal position.

8. The device according to claim 1, further comprising: an operational condition determination system which is mounted on the frame and which is designed to recognize at least one of the following conditions:
   (a) a marking is arranged on the magazine, indicating that the components in the magazine are of the same type as components that are to be transferred into the reservoir;
   (b) the magazine receiving device is in the receiving position;

(c) the magazine receiving device is in the withdrawal position;
(d) the holding device is in an opening position;
(e) the holding device is in a closing position.

9. The device according to claim 1, further comprising: a reservoir determination system which is arranged to recognize at least one of the following conditions:
   (a) a reservoir is held by the holding device;
   (b) the reservoir held by the holding device is in a predetermined position; and
   (c) the reservoir held by the holding device comprises a marking indicative that the reservoir is a predetermined reservoir.

10. The device according to claim 9, wherein the reservoir determination system is mounted on the frame.

11. The device according to claim 1, further comprising: an actuator which is mounted on the frame and which is positioned and adapted such that a shutter of a reservoir held by the holding device can be displaced between a first position and a second position, wherein in the first position the reservoir is opened, so that the reservoir can be filled with components, and in the second position the reservoir is closed, so that no components can enter the reservoir or can exit it.

12. The device according to claim 11, wherein the holding device cooperates with the actuator and is configured such that inserting the reservoir into the holding device and withdrawing the reservoir from the holding device is possible only when the shutter of the reservoir is in the second position.

* * * * *